United States Patent [19]

Blauschild et al.

[11] Patent Number: 5,610,539
[45] Date of Patent: Mar. 11, 1997

[54] LOGIC FAMILY FOR LOW VOLTAGE HIGH-SPEED APPLICATIONS

[75] Inventors: Robert A. Blauschild, Los Altos; Daniel J. Linebarger, Saratoga, both of Calif.

[73] Assignee: Philips Electronics North America Corporation, New York, N.Y.

[21] Appl. No.: 594,063

[22] Filed: Jan. 30, 1996

Related U.S. Application Data

[63] Continuation of Ser. No. 431,399, Apr. 28, 1995, abandoned, which is a continuation of Ser. No. 78,719, Jun. 16, 1993, abandoned.

[51] Int. Cl.$^6$ ................... H03K 19/086; H03K 19/013
[52] U.S. Cl. .................. 326/127; 326/18; 326/21; 326/33
[58] Field of Search ........................ 307/455, 443, 307/458, 445, 454; 326/126–127, 131, 21, 26, 31, 33, 18, 89–90

[56] References Cited

U.S. PATENT DOCUMENTS

| | | | |
|---|---|---|---|
| 4,390,848 | 6/1983 | Blauslchild | 330/151 |
| 4,408,134 | 10/1983 | Allen | 307/455 |
| 4,532,479 | 7/1985 | Blauschild | 330/261 |
| 4,542,305 | 9/1985 | Blauschild . | |
| 4,649,352 | 3/1987 | Blauschild | 330/261 |
| 4,677,315 | 6/1987 | Blauschild et al. . | |
| 4,754,173 | 6/1988 | Smith et al. | 307/455 |
| 4,877,977 | 10/1989 | Kokado . | |
| 5,053,645 | 10/1991 | Harada | 307/455 |
| 5,111,074 | 5/1992 | Gravrok et al. | 307/455 |
| 5,115,206 | 5/1992 | Mack et al. | 330/261 |
| 5,206,547 | 4/1993 | Houghten et al. | 307/455 |

OTHER PUBLICATIONS

ISSCC73/Feb. 16, 1973;1973 IEEE International Solid-State Circuits Conference, Session XIII: High Performance Logic, Z.E. Skokan.
"Basic Integrated Circuit Engineering" McGraw–Hill Book Company, New York, 1975 pp. 492–497.
"A Differential Logic Structure For Bipolar" Electronic Product Design, Jan. 1986, pp. 43–46.
"Pulse, Digital, and Switching Waveforms" Millman et al, McGraw–Hill Book Company, 1965 pp. 358–359.

*Primary Examiner*—Edward P. Westin
*Assistant Examiner*—Jon Santamauro
*Attorney, Agent, or Firm*—Steven R. Biren

[57] ABSTRACT

A new logic family is identified that achieves much better speeds than CML logic gates. This new logic family operates with multiple inputs and a single logic level, using differential pairs of transistors for each input transistor of the multiple input. This new logic family enables high speed operation, or higher speed, than the prior art, together with lower operating current and a power-delay enhancement significantly increased over the prior art.

6 Claims, 2 Drawing Sheets

5,610,539

LOGIC FAMILY FOR LOW VOLTAGE HIGH-SPEED APPLICATIONS

This is a continuation of application Ser. No. 08/431,399, filed Apr. 28, 1995, now abandoned which is a continuation of Ser. No. 08/078,719, filed Jun. 16, 1993, now abandoned.

The present invention is directed to new circuitry for providing a logic family which can operate under a low voltage at high-speeds. In particular, the new logic circuitry of the present invention enables operation with a supply voltage of 1 volt, while retaining differential logic with fewer devices and lower operating current.

BACKGROUND OF THE INVENTION

Current-mode logic (CML) circuitry, such as shown in Colace, Electronic Product Design, January 1986, pages 43–46; Millman et al, "Pulse Digital, and Switching Waveforms", McGraw, Hill Book Company, New York, 1965, pages 358–359; and Hamilton et al "Basic Integrated Circuit Engineering", McGraw-Hill Book Company, New York, 1975, pages 492–497, offers high speed, but the required stacking of logic levels limits performance when low voltage supply operation is necessary. For operation below 2 volts, for example, only two logic levels can be used. A four-input gate is only achieved using a cascade of two-input gates. This leads to several gate delays and extra level shifts.

Such two-input gates must be combined with level shifting buffers to realize a four-input gate. Single ended logic can be much simpler, but the lack of differential signal paths makes the logic more prone to noise, especially from the voltage supply. This problem is aggravated in the case of high-speed logic in which small signal swings are required.

Two common forms of CML that are used include a multi-level CML shown in FIG. 1 and a single-ended version shown in FIG. 2. The multi-level CML of FIG. 1 is differential, but requires different logic levels for inputs A, $\overline{A}$ and B, $\overline{B}$. Emitter followers can be used to translate from the top level to the bottom level as shown in FIG. 1.

The current-mode logic (CML), illustrated in FIG. 1, offers high speed, but the required stacking of logic levels limits performance. This performance limitation is especially noticeable when a low voltage supply operation is necessary. For operation below two volts, for example, only two logic levels can be used. A four-input gate must be realized with a cascade of two-input gate leading to several gate delays and extra level shifts. The prior art logic of CML shown in FIG. 1 indicates how two-input gates are combined with level-shifting buffers to form a four input gate.

The single-ended logic version shown in FIG. 2 operates with a reference voltage, $V_{REF}$. This circuitry shows single-ended logic which is much simpler, but the lack of differential signal paths makes the logic more susceptible to noise, especially from the voltage supply. This problem is aggravated in the case of high-speed logic in which small signal-swings are required.

SUMMARY OF THE INVENTION

The present invention is directed to logic circuitry which comprises a multiple input stage having a plurality of gates disposed in parallel, coupled to a reference transistor being driven by differential of transistors.

Such new logic family operates at the high speed offered by CML circuitry, but with lower supply voltages. This structure enables a significantly increased speed advantage with less current and power-delay enhancement of multiple amounts.

In particular, the circuitry of the present invention may comprise a number n of input transistors in parallel to form the input stage coupled to a transistor driven by a plurality of n differential pairs of driving transistors where the value of n is greater than 1. The input stage may consist of two input transistors with a differential pair of driving transistors for each input transistor. Alternatively, the input stage may comprise four input transistors with four differential pairs of driving transistors.

Such multiple input stage structure forms a structure similar to a single-ended logic. In the present invention, a voltage is input at the base of a reference transistor. Differential pairs of transistors provide this voltage depending on the input voltage values to the multiple input transistors. Thus, if one input is high while the other is low, the voltage introduced at the base of the reference transistor is reduced, thereby resulting in one output being high while the other output is low. The logic gate outputs can be connected to the inputs of other gates in a desired logic design.

Alternatively, if the inputs to respective multiple input transistors were exchanged, the results are the same. If none of the inputs of the multiple input transistors is high, then current flows through the differential pairs of transistors so that the voltage at the base of the reference transistor will be high. Accordingly, the one output would be low, while the other output is high.

For the case when the inputs to the multiple input transistors are high, then the differential pairs of transistors drive the reference transistor to duplicate the logic function with either of the inputs being high. The only difference is that with all inputs being high the voltage across a resistance to the base of the reference transistor is increased. Eventually, the voltage at the base of the reference transistor can be pulled low enough to saturate common ones of the differential pairs of transistors, so that the speed of the logic will deteriorate. A Schottky diode can be used to limit the voltage across the resistance if necessary to prevent saturation.

BRIEF DESCRIPTION OF THE DRAWING FIGURES

The invention will be described in more detail with reference to the drawing figures in which.

DESCRIPTION OF THE INVENTION

Figure 3:
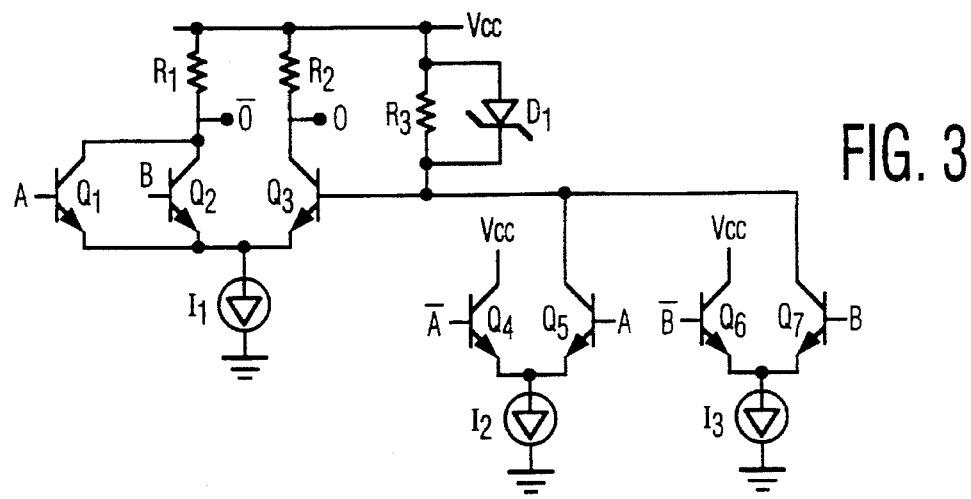
FIG. 3 is a circuit diagram of the new logic family of the present invention.

The new logic family of the present invention operates within a supply range of 1 $V_{BE}$ plus 1 $V_{CESAT}$, allowing a single-cell battery application. In FIG. 3 the minimum operating voltage for one input transistor, such as $Q_1$ receiving $V_{cc}$, is $V_{BES}+V_{12}$ (the voltage across current source $I_2$). The voltage across $I_2$ can be as low as $V_{CESAT}$, which may be approximately 0.1 to 0.2 volts. For $V_{BE}$ equal to 0.6 to 0.7 volts, the minimum $V_{cc}$=0.7 to 0.9 volts. This is only the lower supply limit, and the circuit can function up to the breakdown voltage of current sources $I_1$ and $I_2$.

The single-cell battery application can operate over the voltage 1.1 to 1.5 volts. The new-logic family of the present invention will operate properly with this supply, but the multilevel CML of the prior art will not.

In the structure of the present invention, as illustrated in FIG. 3, differential logic is maintained, however, fewer devices and less operating current are required. This is distinctive from the cascaded CML of the prior art.

Figure 2:
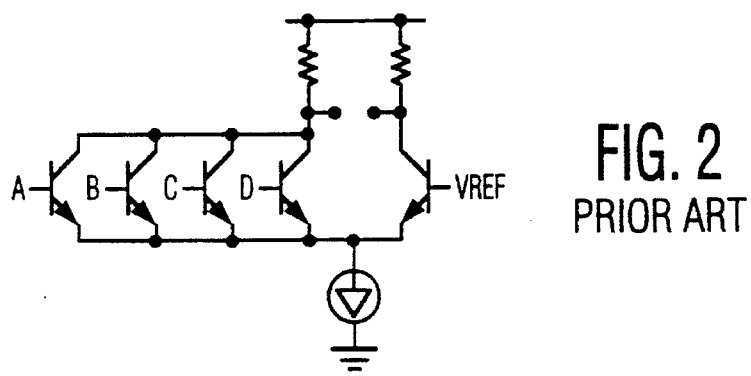
FIG. 2 shows a prior art example of single-ended logic which suffers from various problems.

FIG. 3 shows a schematic circuitry of a two-input version of the new logic. Transistors $Q_1$ $Q_2$, and reference transistor $Q_3$ form a structure similar to the single-ended logic of FIG. 2. In the new logic of FIG. 3, however, the voltage at the base of reference transistor $Q_3$ is driven by differential pairs of transistors $Q_4$, $Q_5$ and $Q_6$, $Q_7$. This gate requires one more transistor than a two-input CML gate including second level buffers, but it can operate off of a lower supply voltage. The gate can be expanded to n inputs by adding input transistors in parallel with transistors $Q_1$ and $Q_2$ and adding differential pairs of transistors in parallel with transistor pair $Q_6$, $Q_7$.

In FIG. 3, if the input A to transistor $Q_1$ is high and the input B to transistor $Q_2$ is low, then current will flow through transistors $Q_5$ and $Q_6$ of the respective differential pairs of transistors $Q_4$, $Q_5$ and $Q_6$, $Q_7$. The current through transistor $Q_5$ also flows through resistance $R_3$ to reduce the voltage at the base of reference transistor $Q_3$. Since the voltage at the base of the transistor $Q_1$, is high and the voltage at the bases of transistors $Q_2$ and $Q_3$ are low, then transistor $Q_1$ conducts and output O will be high and output $\overline{O}$ will be low. Outputs 0 and $\overline{O}$ are the logic gate outputs and can be connected to the inputs of the other gates in the desired logic design. This analysis is the same if input A is low and input B is high.

If neither input A nor input B is high, then current flows through transistors $Q_4$ and $Q_6$ and the voltage at the base of the reference transistor $Q_3$ will be high. Then, where transistors $Q_1$ and $Q_2$ are off and reference transistor $Q_3$ is conducting, the output O will be low and the output $\overline{O}$ will be high.

For both inputs A and B being high, then transistors $Q_5$ and $Q_7$ will conduct, duplicating the logic function that occurs with either input A or B being high. The only difference is that with both inputs being high, the voltage across $R_3$ is doubled. As more logic inputs are added, for example, inputs C and D in FIG. 4, the voltage across $R_3$ increases with multiple high inputs. Eventually, the voltage at the base of reference transistor $Q_3$ can be pulled low enough to saturate transistors $Q_5$, $Q_7$, etc., and the speed of the logic will deteriorate. The Schottky diode $D_1$ 1 may be used to limit voltage across $R_3$ to prevent saturation of the transistors.

The Schottky diode may also be included across the resistance $R_3$ to limit the swing.

Figure 4:
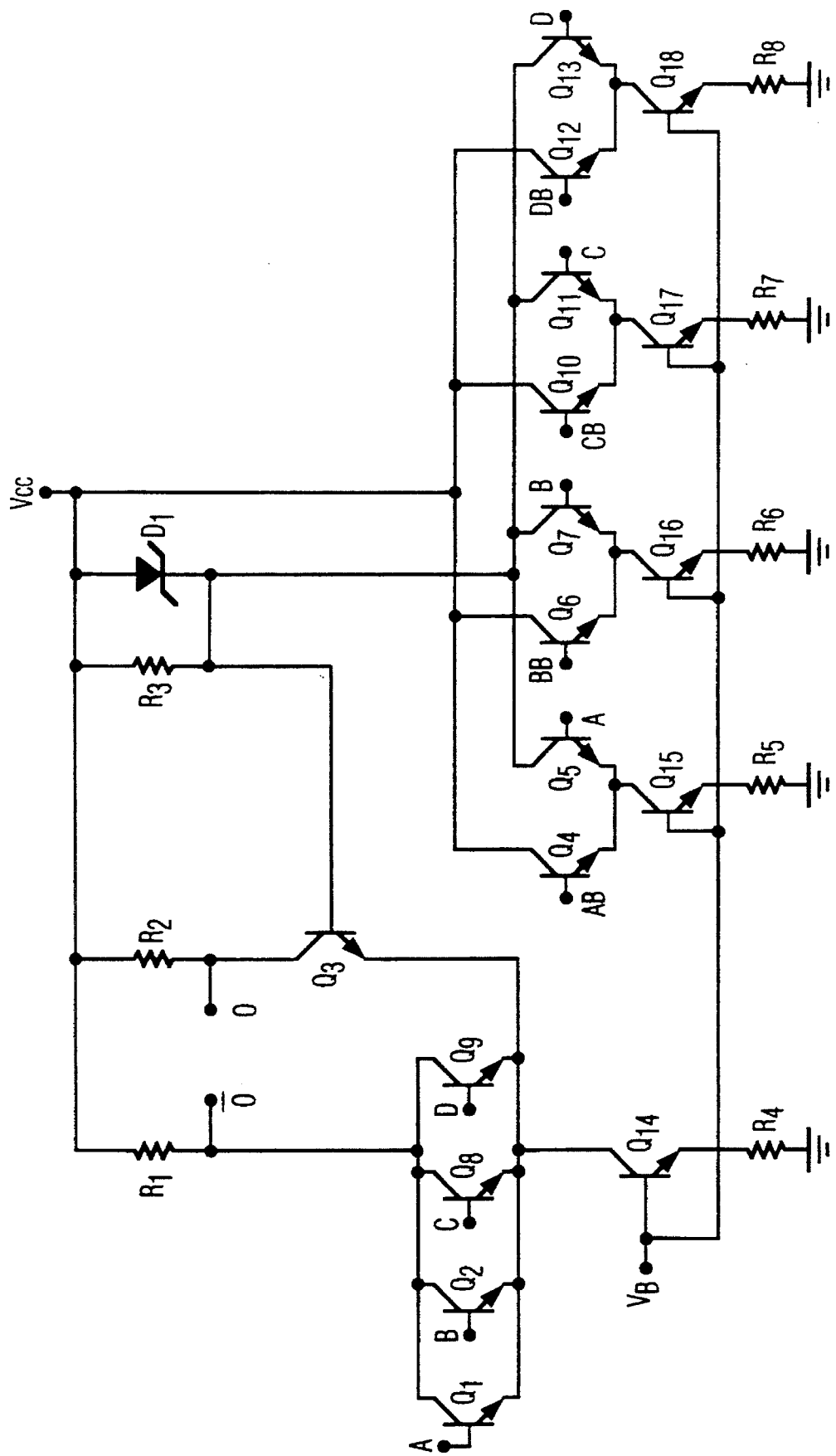
FIG. 4 is an expanded version of the new logic family of the present invention.

FIG. 4 shows a schematic circuit diagram of the new logic family with a four-input gate. This circuit includes two additional input transistors $Q_8$, $Q_9$ together with additional differential pairs of transistors $Q_{10}$, $Q_{11}$ and $Q_{12}$, $Q_{13}$. These additional differential pairs of transistors are included with differential pairs of transistors $Q_4$, $Q_5$ and $Q_6$, $Q_7$ to drive reference transistor $Q_3$ and are coupled through reference transistor $Q_3$ to multiple inputs A, B, C, D for the respective transistors $Q_1$, $Q_2$, $Q_8$, $Q_9$.

Operation of this circuitry is similar to that of FIG. 3, but shows an increased input and driving arrangement for the new logic family. Further, it shows that any number n of input transistors with a similar number n of differential driving transistors will operate the circuitry.

Figure 1:
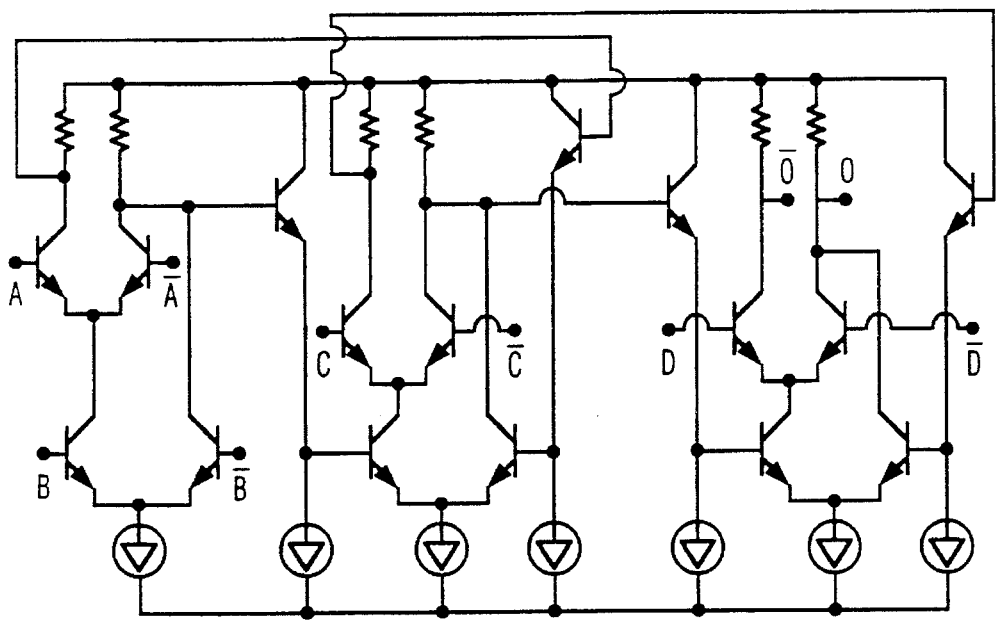
FIG. 1 represents a prior art showing of a two input gate CML.

Ring oscillators may be used to compare the logic family performance of the prior art and the present invention. A nine-stage CML ring (representing three cascaded, four-input gates of the CML logic of FIG. 1) may be compared to a seven stage ring of the new logic gate. The results are shown by comparison in the TABLE to provide a 36% speed advantage using 45% less current for the new logic. Since the CML gates of the prior art require a 2 volt supply versus a 1 volt supply for the new logic, a power-delay enhancement of 5.7 times is achieved. These advantages are achieved in addition to a more than 50% gate-area reduction due to fewer required devices in the new logic.

TABLE

| 4-INPUT GATE COMPARISON | | | |
|---|---|---|---|
| ITEM | CML | NEW LOGIC | COMPARISON |
| No of Stages | 3 | 7 | |
| Osc. FREQUENCY | 130 MHz | 86 MHz | |
| Gate Delay | 1.29 nSec | 0.83 nSec | 36% less delay |
| CURRENT/GATE | 165 µA | 90 µA | 45% less current |
| Power-Delay Product | 4.24 pJ | 0.745 pJ | 5.7X |
| Supply voltage | 2V | 1V | |
| transistors/gate | 27 | 18 | |
| resistors/gate | 15 | 8 | |

Additional speed can be obtained by combining the devices with common collectors into single tubs to reduce capacitance. For typical bipolar processing, the term "tubs" is known as isolated epitaxial pockets or diffusion areas for semiconductor manufacture. For example, from FIG. 3, the transistors Q1 and Q2 can be combined in semiconductor manufacture of the logic, as well as the transistors Q5 and Q7 and Q4 and Q6. The Schottky diode also can be included in the Q5, Q7 tub. If the diode is not required to prevent saturation due to smaller swings or lower common-mode inputs, for example, then its removal can improve speed in the circuitry.

What we claim:

1. A circuit for a high speed logic gate structure comprising a multiple input stage having a plurality of transistors connected in parallel, a reference transistor connected to said plurality of transistors, and a plurality of differential pairs of transistors with outputs connected in parallel to provide a signal to the base of said reference transistor to provide differential outputs from the circuit.

2. A circuit according to claim 1, wherein said plurality of differential pairs of transistors are equal in number to said plurality of transistors of said multiple input stage.

3. A circuit according to claim 1, wherein said signal is complementary to output signals of said multiple input stage.

4. A circuit according to claim 1, wherein a resistance is provided between voltage input to the circuit and the base of said reference transistor.

5. A circuit according to claim 4, wherein a Schottky diode is provided in parallel to said resistance in order to prevent saturation of said differential pairs of transistors.

6. A circuit according to claim 1, wherein the circuit operates with a total supply voltage of about 1 volt.

* * * * *